(12) United States Patent
Takahashi et al.

(10) Patent No.: US 8,889,524 B2
(45) Date of Patent: Nov. 18, 2014

(54) SUBSTRATE TREATING METHOD, STACK AND SEMICONDUCTOR DEVICE

(71) Applicant: JSR Corporation, Tokyo (JP)

(72) Inventors: Seiichirou Takahashi, Tokyo (JP); Hirofumi Gotou, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/874,489

(22) Filed: May 1, 2013

(65) Prior Publication Data

US 2013/0299946 A1 Nov. 14, 2013

(30) Foreign Application Priority Data

May 8, 2012 (JP) ................. 2012-106681

(51) Int. Cl.
*H01L 21/30* (2006.01)
*H01L 21/46* (2006.01)
*H01L 29/02* (2006.01)
*H01L 21/02* (2006.01)
*H01L 21/683* (2006.01)

(52) U.S. Cl.
CPC ....... *H01L 21/02* (2013.01); *H01L 2221/68327* (2013.01); *H01L 29/02* (2013.01); *H01L 2221/68381* (2013.01); *H01L 21/6835* (2013.01); *H01L 2221/6834* (2013.01)
USPC ......................................... 438/455

(58) Field of Classification Search
CPC ............ H01L 29/0657; H01L 2924/14; H01L 21/6835; H01L 23/544; H01L 21/78
USPC ...................... 438/455, 4; 257/618
See application file for complete search history.

(56) References Cited

U.S. PATENT DOCUMENTS

| 7,713,835 B2 | 5/2010 | Pillalamarri |
| 2003/0004302 A1 | 1/2003 | Okamoto et al. |
| 2008/0200011 A1 | 8/2008 | Pillalamarri et al. |
| 2009/0218560 A1* | 9/2009 | Flaim et al. ........................ 257/9 |
| 2010/0206479 A1 | 8/2010 | Pillalamarri et al. |
| 2012/0034437 A1* | 2/2012 | Puligadda et al. ............ 428/212 |

FOREIGN PATENT DOCUMENTS

| JP | 04-020530 | 1/1992 |
| JP | 07-097447 | 4/1995 |
| JP | 2002-338688 | 11/2002 |
| JP | 2004-352920 | 12/2004 |
| JP | 2006-089595 | 4/2006 |
| JP | 2010-506406 | 2/2010 |

* cited by examiner

*Primary Examiner* — Lex Malsawma
*Assistant Examiner* — Long Le
(74) *Attorney, Agent, or Firm* — Oblon, Spivak, McClelland, Maier & Neustadt, L.L.P.

(57) ABSTRACT

A method that includes, in the sequence set forth, (1) temporarily fixing a substrate onto a support via a temporary fixing material including a central section (A) having two or more layers and a peripheral section (B) with solvent resistance, section (B) being in contact with a peripheral portion of the support on the substrate side and with a peripheral portion of the substrate on the support side, section (A) being in contact with a central portion of the support on the substrate side and with a central portion of the substrate on the support side, the temporary fixing thus resulting in a stack in which section (A) is covered with the support, section (B) and the substrate; (2) processing the substrate and/or transporting the stack; (3) dissolving section (B) with a solvent; and (4) heating the residue of the temporary fixing material and separating the substrate from the support.

6 Claims, 3 Drawing Sheets

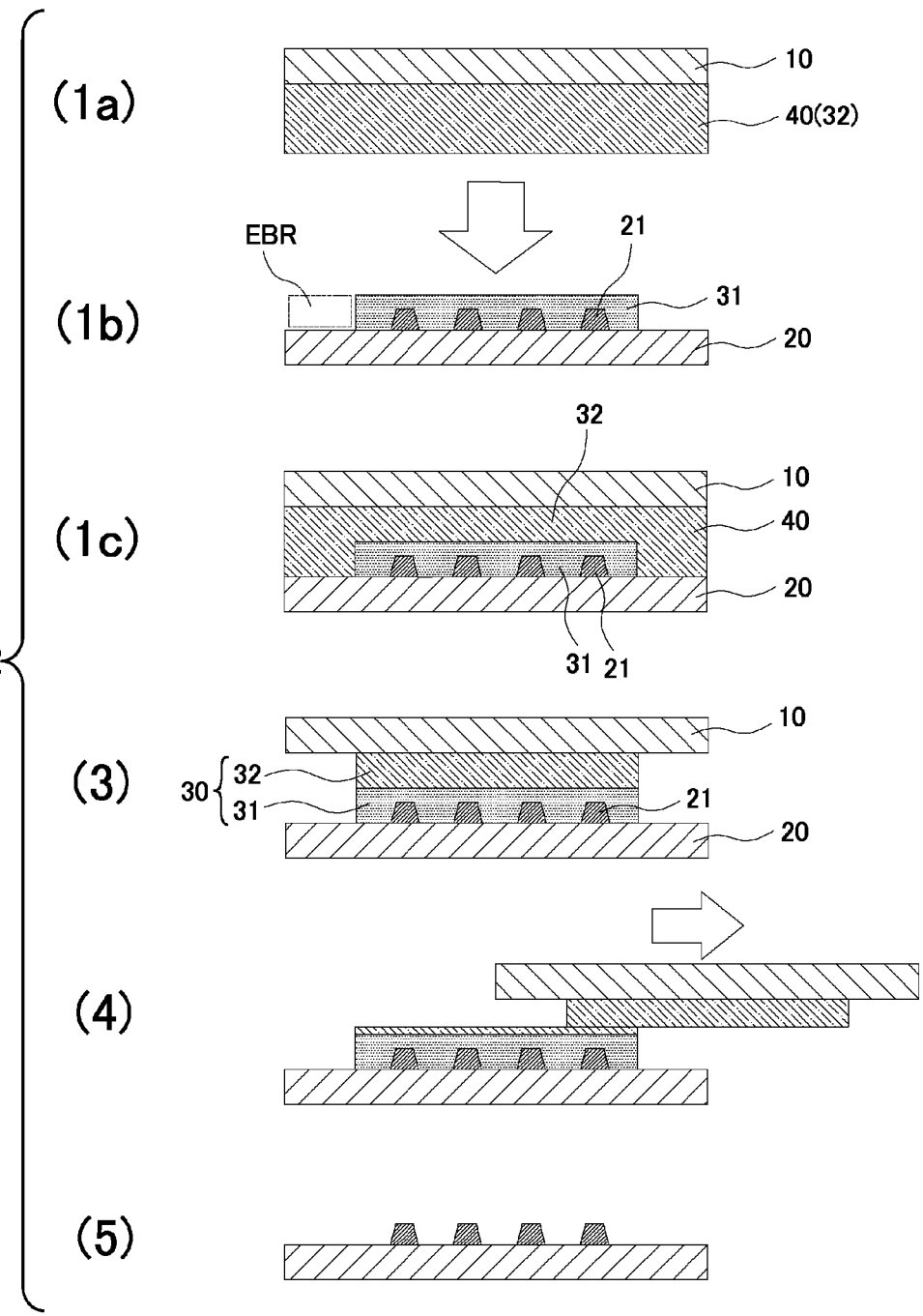

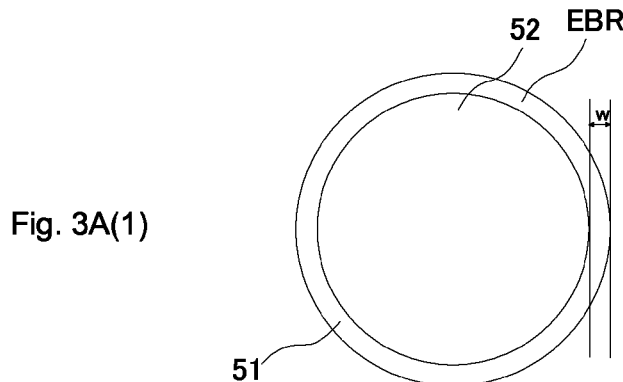
Fig. 3A(1)
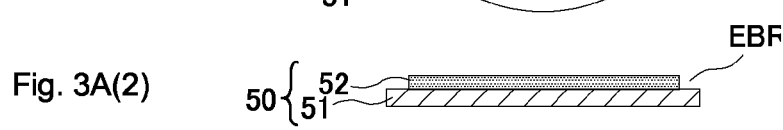
Fig. 3A(2)
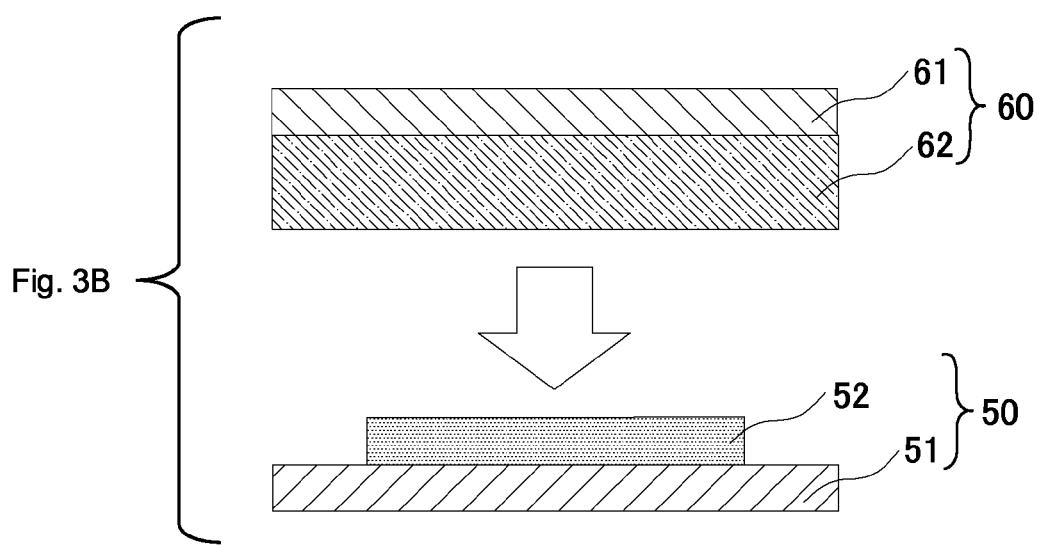
Fig. 3B
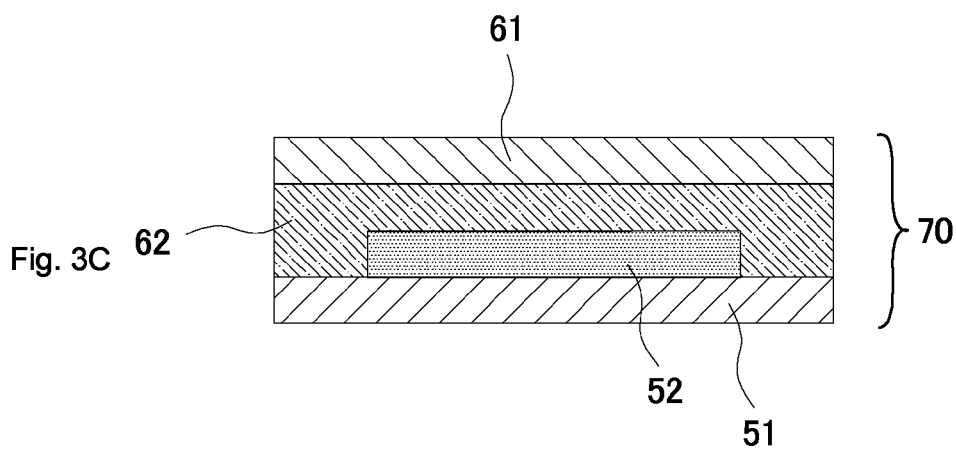
Fig. 3C

SUBSTRATE TREATING METHOD, STACK AND SEMICONDUCTOR DEVICE

BACKGROUND OF THE INVENTION

1. Field of the Invention

The present invention relates to a method for treating a substrate while temporarily fixing the substrate on a support with a temporary fixing material, to a stack having the temporary fixing material, and to a semiconductor device.

2. Description of the Related Art

Substrates such as semiconductor wafers need to be temporarily fixed to supports via temporary fixing materials and so on to make sure that the substrates will not move and become displaced with respect to the supports during processing (for example, dicing, backgrinding and photofabrication) or transportation (for example, transportation between apparatuses). Such temporary fixing materials are required to allow the substrates to be separated from the supports after the completion of processing and/or transportation. Several types of adhesives proposed in the art are possibly applicable to the temporary fixation of substrates (see Patent Literatures 1 and 2).

Patent Literature 1 discloses a wafer bonding (and separating) method including providing a stack including first and second substrates bonded together via a bonding composition layer formed from a composition including a cycloolefin resin and so on dissolved or dispersed in a solvent; and subjecting the stack to a temperature enough to soften the bonding layer and thereby separating the first substrate and the second substrate from each other. This bonding layer consists of a single layer.

Patent Literature 2 discloses a method for temporarily bonding a first substrate and a second substrate, in which a stack is formed during the course of temporary bonding that includes the first substrate, the second substrate, an adhesive layer bonding respective peripheral regions of the first substrate and the second substrate, and a separation layer formed of a fill material filling a central space created by the adhesive layer.

In recent processes such as photofabrication, substrates are often exposed to a high temperature environment. For example, in a mounting step in the manufacturing of stacked chips, wafers or chips are temporarily fixed to supports, then the wafers or chips are processed (for example, subjected to throughhole formation, bump formation, rewiring, wafer thinning and wafer dicing) and the chips are stacked (for example, a plated metal is melt flowed to form an electrical connection between chips), and the chips are separated from the supports.

Such cases require temporary fixing materials which can protect substrates such as semiconductor chips and bumps from damages during processing even at high temperatures without being molten, namely, which exhibit excellent heat resistance.

The realization of such temporary fixing materials entails resins having high melting temperature. However, such resins generally show high solubility in high polarity solvents. Thus, the use of high polarity solvents as processing solvents in the processing of chips and the like restricts the choice of resins for temporary fixing materials to those exhibiting high resistance to such solvents.

CITATION LIST

Patent Literature

Patent Literature 1: JP-A-2010-506406
Patent Literature 2: US 2009/0218560 A1

SUMMARY OF THE INVENTION

An object of the invention is to provide a substrate treating method that allows a wide choice of resins to form a layer in a temporary fixing material disposed in contact with a portion of a substrate where bumps and so on are formed. Another object of the invention is to provide a stack, a temporary fixing composition and a semiconductor device associated with the substrate treating method.

The present inventors carried out extensive studies in order to achieve the above objects. As a result, the present inventors have found that the objects are achieved with a substrate treating method having the following configurations, thus completing the invention. That is, the present invention pertains to, for example, the following aspects [1] to [6].

[1] A substrate treating method including, in the sequence set forth, (1) a step of temporarily fixing a substrate onto a support via a temporary fixing material, the temporary fixing material including a central section (A) having two or more layers and a peripheral section (B) with excellent solvent resistance, the peripheral section (B) being in contact with a peripheral portion of a surface of the support on the substrate side as well as with a peripheral portion of a surface of the substrate on the support side, the central section (A) being in contact with a central portion of the surface of the support on the substrate side as well as with a central portion of the surface of the substrate on the support side, these central portions being within the insides of the respective peripheral portions, the temporary fixing thus resulting in a stack in which the central section (A) is covered with the support, the peripheral section (B) and the substrate; (2) a step of processing the substrate and/or transporting the stack; (3) a step of dissolving at least the peripheral section (B) of the temporary fixing material with a solvent; and (4) a step of heating the residue of the temporary fixing material and separating the substrate from the support.

[2] The substrate treating method described in [1], wherein a layer of the central section (A) disposed in contact with the substrate has the highest melting temperature among the peripheral section (B) and the layers forming the central section (A).

[3] The substrate treating method described in [1] or [2], wherein a layer of the central section (A) disposed in contact with the support, and the peripheral section (B) are composed of an identical resin.

[4] The substrate treating method described in [3], wherein the step (1) includes a step (1a) of forming a temporary fixing material layer (b) with excellent solvent resistance on the entirety of a surface of the support on the substrate side, a step (1b) of forming a temporary fixing material layer (a) on a central portion of a surface of the substrate on the support side, the temporary fixing material layer (a) having a higher melting temperature than the temporary fixing material layer (b), and a step (1c) of arranging the support and the substrate such that the temporary fixing material layer (b) and the temporary fixing material layer (a) are opposed to each other, and bonding the temporary fixing material layer (b) and the temporary fixing material layer (a) to each other while heating the temporary fixing material layer (b), thereby forming a peripheral section (B) composed of part of the temporary fixing material layer (b) and a central section (A) composed of the remaining part of the temporary fixing material layer (b) and the temporary fixing material layer (a).

[5] A stack in which a substrate is temporarily fixed on a support via a temporary fixing material, the temporary fixing material including a peripheral section (B) with excellent solvent resistance disposed in contact with a peripheral portion of a surface of the support on the substrate side as well as with a peripheral portion of a surface of the substrate on the support side, and a central section (A) having two or more layers and disposed in contact with a central portion of the surface of the support on the substrate side as well as with a central portion of the surface of the substrate on the support side, these central portions being within the insides of the respective peripheral portions, the central section (A) being covered with the support, the peripheral section (B) and the substrate.

[6] A semiconductor device obtained by the substrate treating method described in any of [1] to [4].

The substrate treating method according to the present invention allows a wide choice of resins to form a layer in a temporary fixing material that is disposed in contact with a portion of a substrate where bumps and so on are formed. Stacks, temporary fixing compositions and semiconductor devices associated with the substrate treating method are also provided by the invention.

According to the invention, a section (a peripheral section (B)) of a temporary fixing material that is to be exposed to processing solvents exhibits excellent solvent resistance. This configuration enables a wide choice of resins to form a layer in a central section (A) that is disposed in contact with a substrate (in particular, bumps). As an example, when N-methyl-2-pyrrolidone (NMP) is used as a processing solvent, cycloolefin resins which have high melting temperature and are resistant to NMP are the only choice in conventional temporary fixing materials composed of a single layer, whilst according to the invention polyimides, polyether sulfones and so on which have high melting temperature but are non-resistant to NMP can be used to form a layer in contact with a substrate.

BRIEF DESCRIPTION OF THE DRAWINGS

FIG. 2 is a set of sectional views illustrating an embodiment of a substrate treating method.

FIGS. 3A(1), 3A(2), 3B, and 3C is a set of sectional views illustrating an embodiment of a substrate treating method in Examples.

DESCRIPTION OF THE PREFERRED EMBODIMENTS

Figure 1A:
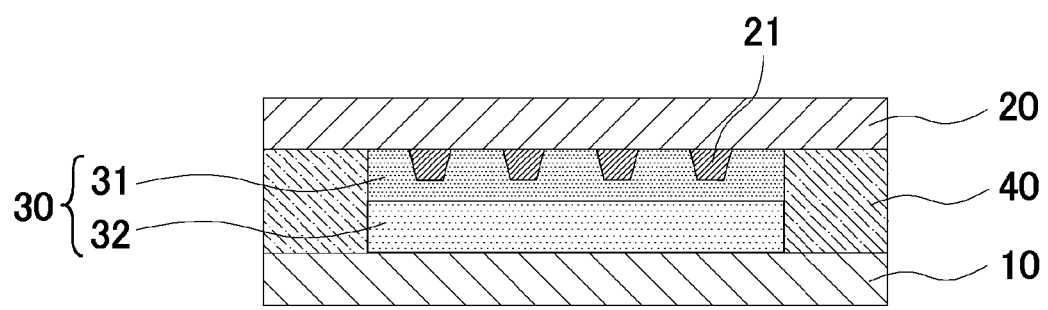
FIG. 1A illustrates an example of a cross section of a stack.

Hereinbelow, there will be described substrate treating methods of the invention, stacks and temporary fixing compositions associated with the substrate treating methods, and semiconductor devices obtained by the substrate treating methods.

In the present invention, the term "temporary fixing materials" refers to materials used to temporarily fix substrates such as semiconductor wafers to supports in order to make sure that the substrates will not move and become displaced with respect to the supports during processing (for example, dicing, backgrinding and photofabrication (e.g., resist pattern formation, formation of metal bumps by plating or the like, film formation by chemical vapor deposition or the like, and processing such as RIE)) or during transportation (for example, transportation between apparatuses).

[Substrate Treating Methods]

A substrate treating method of the invention includes, in the sequence set forth:

(1) a step of temporarily fixing a substrate onto a support via a temporary fixing material including a central section (A) and a peripheral section (B) such that a stack is obtained in which the central section (A) is covered with the support, the peripheral section (B) and the substrate;

(2) a step of processing the substrate and/or transporting the stack;

(3) a step of dissolving at least the peripheral section (B) of the temporary fixing material with a solvent; and (4) a step of heating the residue of the temporary fixing material and separating the substrate from the support.

Hereinbelow, the above steps will be also referred to as the steps (1) to (4), respectively.

The peripheral section (B) exhibits excellent solvent resistance and, in the stack formed in the step (1), is in contact with a peripheral portion of a surface of the support on the substrate side as well as with a peripheral portion of a surface of the substrate on the support side. The central section (A) includes two or more layers and, in the stack formed in the step (1), is in contact with a central portion of the surface of the support on the substrate side as well as with a central portion of the surface of the substrate on the support side, these central portions being within the insides of the respective peripheral portions.

Thus, in the invention, a support and a substrate are temporarily fixed together via the temporary fixing material that includes the central section (A) and the peripheral section (B) extending outward from the central section (A) in a radial direction (a direction perpendicular to the stacking direction of the stack). Consequently, the resultant stack has a structure in which the central section (A) is covered with the support, the peripheral section (B) and the substrate. Because the peripheral section (B) has excellent solvent resistance, any resins that are poor in solvent resistance but exhibit excellent heat resistance may be used to form the central section (A), namely, to form a portion which is responsible for the protection of bumps and so forth on a substrate, thus providing a greater choice of resins to be used in the central section (A).

[Step (1)]

In the step (1), a substrate is temporarily fixed onto a support via a temporary fixing material including a central section (A) and a peripheral section (B), resulting in a stack having a support/temporary fixing material/substrate structure. In the temporary fixing material, the peripheral section (B) extends outward from the central section (A) in a radial direction.

FIG. 1A illustrates an embodiment of the stack, in which a substrate 20 having bumps 21 is temporarily fixed on a support 10 via a temporary fixing material. The temporary fixing material includes a peripheral section 40 with excellent solvent resistance that is in contact with a peripheral portion of the support 10 and a peripheral portion of the substrate 20, as well as a central section 30 having a support side layer 32 in contact with a central portion of the support 10 and a substrate side layer 31 in contact with a central portion of the substrate 20. The central section 30 is covered with the support 10, the peripheral section 40 and the substrate 20.

Figure 1B:
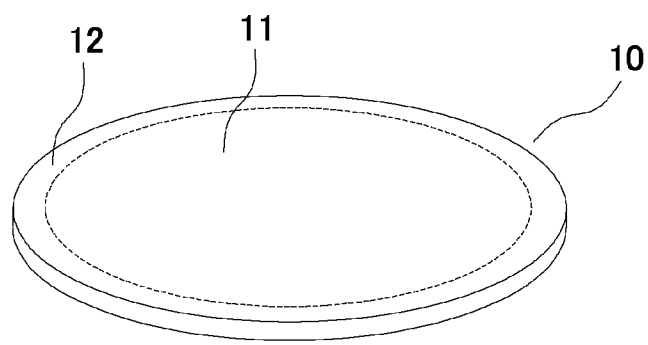
FIG. 1B is a perspective view of a support.

The peripheral portions and the central portions of the substrate and the support will be described with reference to FIG. 1B. FIG. 1B is a perspective view of the support 10. In the support 10, the surface on the substrate 20 side includes a central portion 11 and a peripheral portion 12. As illustrated, the peripheral portion extends inward from the periphery of the substrate or the support in a radial direction to a prescribed distance, and the central portion is the surface of the substrate or the support excluding the peripheral portion.

(Substrates and Supports)

Examples of the substrates to be processed (transported) include semiconductor wafers, glass plates, resin plates, metal plates, metal foils, polishing pads and resin films. Semiconductor wafers usually have components such as bumps, wires and insulating films. Exemplary resin films include a film containing an organic component as a major ingredient. Specific examples include a photosensitive resin film formed of a photosensitive material, an insulating resin film formed of an insulating material, and a photosensitive insulating resin film formed of a photosensitive insulating resin material. Examples of the supports include those which are handled easily and have a hard and flat surface, such as glass and silicon.

In the formation of a temporary fixing material layer on a substrate, the surface of the substrate may be treated beforehand in order to allow the temporary fixing material to be spread evenly over the surface. For example, such surface treatment may be performed by coating the surface of a substrate with a surface treatment agent beforehand.

Examples of the surface treatment agents include coupling agents such as 3-aminopropyl trimethoxysilane, 3-aminopropyl triethoxysilane, 2-aminopropyl trimethoxysilane, 2-aminopropyl triethoxysilane, N-(2-aminoethyl)-3-aminopropyl trimethoxysilane, N-(2-aminoethyl)-3-aminopropylmethyl dimethoxysilane, 3-ureidopropyl trimethoxysilane, 3-ureidopropyl triethoxysilane, N-ethoxycarbonyl-3-aminopropyl trimethoxysilane, N-ethoxycarbonyl-3-aminopropyl triethoxysilane, N-triethoxysilylpropyl triethylenetriamine, N-trimethoxysilylpropyl triethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyl trimethoxysilane, N-benzyl-3-aminopropyl triethoxysilane, N-phenyl-3-aminopropyl trimethoxysilane, N-phenyl-3-aminopropyl triethoxysilane, N-bis(oxyethylene)-3-aminopropyl trimethoxysilane, N-bis(oxyethylene)-3-aminopropyl triethoxysilane and hexamethyldisilazane.

<Peripheral Section (B)>

In the stack, the peripheral section (B) of the temporary fixing material effects temporary fixation between a peripheral portion of the surface of the support on the substrate side and a peripheral portion of the surface of the substrate on the support side. The peripheral section (B) exhibits excellent solvent resistance and protects the central section (A), in particular the layer in contact with the substrate, against processing solvents used during the processing of the substrate.

It is preferable that the peripheral section (B) has a solubility (23° C.) of not more than 1 g/100 g in processing solvents possibly used in steps for substrate processing. In this case, the peripheral section (B) exhibits particularly excellent solvent resistance against processing solvents. Examples of the processing solvents include N-methyl-2-pyrrolidone.

For example, the peripheral section (B) may be formed from a temporary fixing composition including thermoplastic resins (H) and (L) described later. In detail, the peripheral section (B) may be formed using a temporary fixing composition (bb) described later.

<Central Section (A)>

In the stack, the central section (A) of the temporary fixing material effects temporary fixation between a central portion of the surface of the support on the substrate side and a central portion of the surface of the substrate on the support side, these central portions being within the insides of the respective peripheral portions. The central section (A) includes two or more layers.

The central section (A) preferably has a layer in contact with the substrate (a substrate-side outermost layer) which has the highest melting temperature among the peripheral section (B) and the layers forming the central section (A). For example, when the central section (A) is composed of two layers, the substrate-side outermost layer of the central section (A) is defined by a layer with the highest melting temperature. This configuration ensures that the substrate-side outermost layer does not become molten and successfully protects bumps and so forth on the substrate even if the stack is exposed to a high temperature environment (for example, 225 to 300° C.) during substrate processing and so forth. In addition, the temporary fixing material of the invention can maintain holding power enough to hold the substrate against shear force applied during substrate processing even in a high temperature environment. For example, the holding power may be evaluated in terms of shear adhesion.

In the central section (A), it is preferable that a layer in contact with the support (a support-side outermost layer) has a lower melting temperature than the melting temperature of the layer in contact with the substrate (the substrate-side outermost layer). This configuration allows the substrate to be separated from the support by performing appropriate heat treatment when the substrate is to be separated. Part of the central section (A) can possibly remain on the substrate after separation. In such cases, the residue of the central section (A) may be easily removed from the substrate by cleaning with solvents.

In the stack, the central section (A) is composed of two or more layers, and preferably two to five layers. From the viewpoint of high yield, the number of layers is more preferably two. When the central section (A) is composed of two layers, the central section (A) has a layer with a higher melting temperature (hereinafter, also referred to as "higher melting temperature layer") and a layer with a lower melting temperature than the higher melting temperature layer (hereinafter, also referred to as "lower melting temperature layer"). In this case, the higher melting temperature layer defines a temporary fixing material layer (a) and the lower melting temperature layer defines a temporary fixing material layer (b) in a preferred stack formation method described later.

The melting temperature of the substrate-side outermost layer or the higher melting temperature layer is usually 150 to 350° C. The melting temperature of the support-side outermost layer or the lower melting temperature layer is usually 40 to 250° C., and is preferably lower than the melting temperature of the substrate-side outermost layer or the higher melting temperature layer. This configuration of the melting temperatures of these layers provides marked improvements in heat resistance and low-temperature separation properties.

In the invention, the melting temperatures of layers forming the central section (A) are measured in the following manner. A corresponding layer is formed or transferred onto a silicon wafer and is analyzed with a rheometer ("AR-G2 Rheometer" manufactured by TA Instruments Japan Inc., frequency=0.08 Hz) to determine the temperature at which the viscosity becomes 1,000 Pa·s as the melting temperature of the corresponding layer of the temporary fixing material.

For example, the layers may be formed using temporary fixing compositions including a thermoplastic resin (H) and optionally a thermoplastic resin (L) described later. In detail, the substrate-side outermost layer or the higher melting temperature layer may be formed using a temporary fixing composition (aa) described later, and the support-side outermost layer or the lower melting temperature layer may be formed using a temporary fixing composition (bb) described later.

The total thickness of the temporary fixing material may be selected appropriately in accordance with the size of the temporary fixing surface of the substrate as well as the degree of adhesion required during steps such as processing. The total thickness of the temporary fixing material is usually 0.01 μm to 2 mm, preferably 0.05 μm to 1 mm, and more preferably 0.1 μm to 0.5 mm. The thickness of each of the layers of the central section (A) is usually 0.1 to 200 μm, and preferably 0.5 to 150 μm. The above total thickness of the temporary fixing material and thickness of each layer of the central section (A) ensure sufficient holding power and prevent the separation of the substrate at the temporary fixing surface.

<Preferred Stack Formation Method>

For example, the stack is preferably formed by carrying out a step (1a) of forming a temporary fixing material layer (b) with excellent solvent resistance on the entirety of a surface of the support on the substrate side, a step (1b) of forming a temporary fixing material layer (a) on a central portion of a surface of the substrate on the support side, the temporary fixing material layer (a) having a higher melting temperature than the temporary fixing material layer (b), and a step (1c) of arranging the support and the substrate such that the temporary fixing material layer (b) and the temporary fixing material layer (a) are opposed to each other, and bonding the temporary fixing material layer (b) and the temporary fixing material layer (a) to each other while heating the temporary fixing material layer (b), thereby forming a peripheral section (B) composed of part of the temporary fixing material layer (b) and a central section (A) composed of the remaining part of the temporary fixing material layer (b) and the temporary fixing material layer (a) (see FIG. 2).

Hereinbelow, the above steps will be also referred to as the steps (1a) to (1c), respectively.

The sequence of the steps (1a) and (1b) is not particularly limited.

<<Steps (1a) and (1b)>>

For example, the temporary fixing material layer (b) or the temporary fixing material layer (a) may be formed by a method (i) in which the temporary fixing material layer is formed directly on the support and/or the substrate by the application of a temporary fixing composition, or a method (ii) in which a temporary fixing composition is applied to a release-treated PET (polyethylene terephthalate) film with a prescribed coating thickness and the resultant film is transferred onto the support and/or the substrate by lamination. From the viewpoint of the uniformity of film thickness, the method (i) is preferable (see FIG. 2, steps (1a) and (1b)).

Exemplary methods for applying the temporary fixing composition include spin coating methods and inkjet methods. In the case of a spin coating method, for example, the temporary fixing composition may be spin coated at a rotational speed of 300 to 3,500 rpm (preferably 500 to 1,500 rpm) and a rate of acceleration of 500 to 15,000 rpm/sec for a rotational time of 30 to 300 seconds.

After the temporary fixing composition has been applied, for example, the coating may be baked with a hot plate and so on to evaporate the solvent. For example, the baking conditions may be such that the temperature is usually 150 to 275° C., preferably 150 to 260° C., and the baking time is 2 to 15 minutes, preferably 3 to 10 minutes.

In the step (1b), two or more temporary fixing material layers (a) may be formed.

For example, the step (1b) may be performed in such a manner that a temporary fixing material layer is formed on the entire surface of the substrate on the support side and a portion of the layer found on a peripheral portion of the surface of the substrate on the support side (namely, a peripheral portion of the temporary fixing material layer) is removed by EBR (edge bead removal), thereby forming a temporary fixing material layer (a) on a central portion of the substrate (see FIG. 2, step (1b)). The width of the peripheral portion (EBR portion) in a radial direction is usually 0.01 to 10 mm, and preferably 0.1 to 5 mm.

For example, the temporary fixing compositions used in the steps (1a) and (1b) include a thermoplastic resin with a higher melting temperature (hereinafter, also referred to as "thermoplastic resin (H)") and optionally a thermoplastic resin with a lower melting temperature (hereinafter, also referred to as "thermoplastic resin (L)") in appropriate proportions. The details of these resins will be described later.

For example, the melting temperature of the temporary fixing composition may be controlled by appropriately changing the amount of the thermoplastic resin (L) added with respect to the thermoplastic resin (H) as the base. (As an example, increasing the amount of the thermoplastic resin (L) lowers the melting temperature of the temporary fixing composition.)

In the invention, the melting temperatures of the temporary fixing compositions are measured in the following manner. The temporary fixing composition is applied onto a silicon wafer and the resultant coating is heated with a hot plate at 250° C. for 10 minutes to give an 800 μm thick film (a temporary fixing material layer), which is then analyzed with a rheometer ("AR-G2 Rheometer" manufactured by TA Instruments Japan Inc., frequency=0.08 Hz) to determine the temperature at which the viscosity becomes 1,000 Pa·s as the melting temperature of the temporary fixing composition.

For example, the temporary fixing material layer (a) having high melting temperature may be formed using a temporary fixing composition (aa) which includes at least one thermoplastic resin (H) and optionally at least one thermoplastic resin (L) and which exhibits a melting temperature of 150 to 350° C., and preferably 200 to 350° C.

For example, the temporary fixing material layer (b) having high solvent resistance may be formed using a temporary fixing composition (bb) which includes at least one thermoplastic resin (H) and at least one thermoplastic resin (L) and which exhibits a melting temperature that is 40 to 300° C., preferably 50 to 250° C., and is less than the melting temperature of the temporary fixing composition (aa). In this case, the thermoplastic resin (H) is preferably one which has high solvent resistance against processing solvents used in substrate processing. When the processing solvents include N-methyl-2-pyrrolidone, preferred thermoplastic resins (H) are, for example, cycloolefin resins.

In the temporary fixing composition (aa), the use of a thermoplastic resin (L) is possible as long as the above melting temperature is obtained. In such a case, the thermoplastic resin (L) is usually used in an amount of not more than 80 parts by mass, and preferably not more than 50 parts by mass based on 100 parts by mass of the thermoplastic resin (H).

In the temporary fixing composition (bb), the contents of the thermoplastic resins (H) and (L) are controlled appropriately such that the melting temperature of the composition falls in the aforementioned range. The thermoplastic resin (L) is usually used in an amount of 1 to 200 parts by mass, and preferably 5 to 100 parts by mass based on 100 parts by mass of the thermoplastic resin (H).

The temporary fixing compositions may be prepared using any of known apparatuses utilized for the processing of thermoplastic resins, such as twin-screw extruders, single-screw extruders, continuous kneaders, roll kneaders, pressure kneaders and Banbury mixers.

In order to allow the temporary fixing compositions to exhibit viscosity suited for application, solvents are preferably used in the preparation of the compositions. The solvents may be selected appropriately in accordance with the types of the thermoplastic resins. One, or two or more kinds of solvents may be used.

Examples of the solvents include hydrocarbons such as limonene, mesitylene, dipentene, pinene, bicyclohexyl, cyclododecene, 1-tert-butyl-3,5-dimethylbenzene, butylcyclohexane, cyclooctane, cycloheptane, cyclohexane and methylcyclohexane; alcohols/ethers such as anisole, propylene glycol monomethyl ether, dipropylene glycol methyl ether, diethylene glycol monoethyl ether and diglyme; esters/lactones such as ethylene carbonate, ethyl acetate, n-butyl acetate, ethyl lactate, ethyl 3-ethoxypropionate, propylene glycol monomethyl ether acetate, diethylene glycol monoethyl ether acetate, propylene carbonate and γ-butyrolactone; ketones such as cyclopentanone, cyclohexanone, methyl isobutyl ketone and 2-heptanone; and amides/lactams such as N-methyl-2-pyrrolidone.

The use of solvents facilitates controlling the viscosity of the temporary fixing compositions and consequently facilitates the formation of the temporary fixing material layers on the substrate or the support. For example, the solvents may be usually used in such amounts that the total concentration (solid concentration) of the components in the temporary fixing compositions except the solvents becomes 5 to 80 mass %.

Where necessary, the temporary fixing compositions may include other components such as adhesion improvers; particles of metal oxides such as aluminum oxide, zirconium oxide, titanium oxide and silicon oxide; and crosslinked polystyrene particles.

<<Step (1c)>>

The temperature for heating the temporary fixing material layer (b) may be selected appropriately in accordance with, for example, the components in the temporary fixing compositions and the application methods. The heating temperature is usually 50 to 300° C., and preferably 150 to 250° C. Compression bonding may be accomplished by, for example, applying a force of 0.01 to 1 MPa at the above temperature for 0.5 to 15 minutes. This compression bonding pushes part of the temporary fixing material layer (b) into the space created (by EBR) in the temporary fixing material layer (a) on the substrate (see FIG. 2, step (1c)).

In this manner, a stack is obtained in which the substrate is firmly held on the support. In the stack described above, the layer of the central section (A) disposed in contact with the support and the peripheral section (B) are composed of the same resin.

<<Thermoplastic Resins (H) and (L)>>

The thermoplastic resins (H) and (L) are described below.
<Thermoplastic Resin (H)>

Examples of the thermoplastic resins (H) having high melting temperature include cycloolefin resins, polyether sulfones, polycarbonates, polyimides, and mixtures of two or more kinds of these resins. Any of these resins may be used as a constituent resin in the central section (A) (for example, as a resin included in the temporary fixing composition (aa) to form the temporary fixing material layer (a)). That is, a wide choice of resins is provided. A resin which constitutes the peripheral section (B) (for example, a resin included in the temporary fixing composition (bb) to form the temporary fixing material layer (b)) needs to be selected such that high solvent resistance is exhibited in accordance with the processing solvents used in substrate processing. A cycloolefin resin is preferable in view of this.

The melting temperature of the thermoplastic resin (H) is usually not less than 100° C., preferably 150 to 350° C., and more preferably 200 to 350° C. By using the thermoplastic resin (H) having this melting temperature, the melting temperature of the obtainable layer can be set to a high temperature.

<<Cycloolefin Resins>>

Examples of the cycloolefin resins, which are preferred examples of the thermoplastic resins (H), include an addition copolymer of a cyclic olefin and a non-cyclic olefin, a ring-opening metathesis polymer of one, or two or more cyclic olefin, and a hydrogenated product of the ring-opening metathesis polymer. The synthesis of these cycloolefin resins is known in the art.

Examples of the cyclic olefins include norbornene olefins, tetracyclododecene olefins, dicyclopentadiene olefins, and derivatives of these olefins. Examples of such derivatives include derivatives substituted with a substituent such as an alkyl group (preferably an alkyl group having 1 to 20, more preferably 1 to 10 carbon atoms), an alkylidene group (preferably an alkylidene group having 1 to 20, more preferably 1 to 10 carbon atoms), an aralkyl group (preferably an aralkyl group having 6 to 30, more preferably 6 to 18 carbon atoms), a cycloalkyl group (preferably a cycloalkyl group having 3 to 30, more preferably 3 to 18 carbon atoms), a hydroxyl group, an alkoxyl group (preferably an alkoxyl group having 1 to 10 carbon atoms), an acetyl group, a cyano group, an amide group, an imide group, a silyl group, an aromatic ring, an ether bond and an ester bond.

Suitable examples of the cyclic olefins include compounds represented by Formula (1):

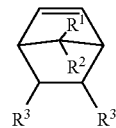

(1)

In Formula (1), the substituents are as follows. $R^1$ and $R^2$ are each independently a hydrogen atom or an alkyl group (preferably an alkyl group having 1 to 20, more preferably 1 to 10 carbon atoms). $R^3$s are each independently a hydrogen atom, an alkyl group (preferably an alkyl group having 1 to 20, more preferably 1 to 10 carbon atoms), a cycloalkyl group (preferably a cycloalkyl group having 3 to 30, more preferably 3 to 18 carbon atoms), an aryl group (preferably an aryl group having 6 to 18 carbon atoms), an aralkyl group (preferably an aralkyl group having 6 to 30, more preferably 6 to 18 carbon atoms), an alkoxyl group (preferably an alkoxyl group having 1 to 10 carbon atoms), an alkoxycarbonyl group (preferably an alkoxycarbonyl group having 2 to 11 carbon atoms), an aldehyde group, an acetyl group or a nitrile group.

The two $R^3$s may be linked together to form one or more ring structures. Examples of such cyclic olefins include compounds represented by Formulae (2) to (7):

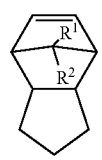

(2)

(3)

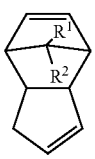

(4)

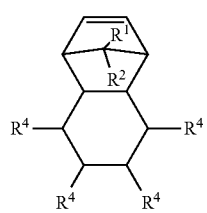

(5)

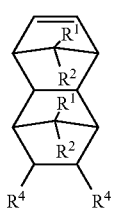

(6)

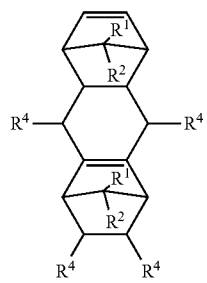

(7)

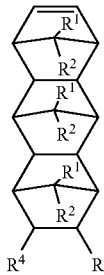

In Formulae (2) to (7), the substituents are as follows. $R^1$ and $R^2$ are each independently a hydrogen atom or an alkyl group (preferably an alkyl group having 1 to 20, more preferably 1 to 10 carbon atoms). $R^4$s are each independently a hydrogen atom, an alkyl group (preferably an alkyl group having 1 to 20, more preferably 1 to 10 carbon atoms), a cycloalkyl group (preferably a cycloalkyl group having 3 to 30, more preferably 3 to 18 carbon atoms), an aryl group (preferably an aryl group having 6 to 18 carbon atoms), an aralkyl group (preferably an aralkyl group having 6 to 30, more preferably 6 to 18 carbon atoms), an alkoxyl group (preferably an alkoxyl group having 1 to 10 carbon atoms), an alkoxycarbonyl group (preferably an alkoxycarbonyl group having 2 to 11 carbon atoms), an aldehyde group, an acetyl group or a nitrile group.

Examples of the non-cyclic olefins include linear or branched olefins having 2 to 20, and preferably 2 to 10 carbon atoms. Ethylene, propylene and butylene are more preferable, and ethylene is particularly preferable.

Addition Copolymers

For example, the addition copolymer of a cyclic olefin and a non-cyclic olefin contains structural units represented by Formula (I) and structural units derived from the non-cyclic olefins (structural units resulting from the reaction of polymerizable double bonds of the non-cyclic olefins).

(I)

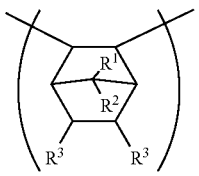

$R^1$ to $R^3$ in Formula (I) are the same as defined in Formula (1).

Examples of commercially available addition copolymers include "TOPAS" manufactured by TOPAS ADVANCED POLYMERS and "APEL" manufactured by Mitsui Chemicals, Inc.

Ring-Opening Metathesis Polymers and Hydrogenated Products Thereof

For example, the ring-opening metathesis polymers of one, or two or more cyclic olefins are polymers containing structural units represented by Formula (II). For example, the polymers obtained by hydrogenating the ring-opening metathesis polymers are polymers containing structural units represented by Formula (III).

(II)

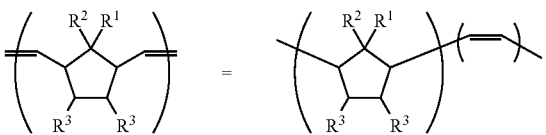

(III)

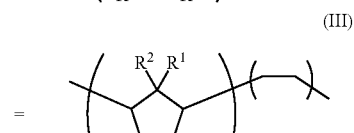

$R^1$ to $R^3$ in Formulae (II) and (III) are the same as defined in Formula (1).

Examples of commercially available ring-opening metathesis polymers include "ZEONOR" and "ZEONEX" manufactured by ZEON CORPORATION, and "ARTON" manufactured by JSR Corporation.

The cycloolefin resins usually have a weight average molecular weight (Mw) of 10,000 to 100,000, and preferably 30,000 to 100,000 as measured by gel permeation chromatography (GPC) relative to polystyrenes. The molecular weight distribution Mw/Mn of the cycloolefin resins is usually 2 to 4, and preferably 3 to 4, wherein Mn is the number average molecular weight of the resin according to gel permeation chromatography (GPC).

<<Polyether Sulfones>>

The polyether sulfones, which are preferred examples of the thermoplastic resins (H), are excellent in adhesion or bonding properties with respect to substrates such as metals and glass, and exhibit excellent heat resistance, chemical resistance, chemical stability, mechanical strength and flame retardance.

Examples of the polyether sulfones include those described in JP-A-2006-89595, JP-A-2004-352920, JP-A-2002-338688, JP-A-H07-97447 and JP-A-H04-20530.

Of the polyether sulfones, those which have an arene structure in the polymer molecule are advantageous in that the crystallinity of the temporary fixing material is increased and it becomes easy for the temporary fixing material to be capable of maintaining shear adhesion enough to hold the substrates against shear force applied during substrate processing even in a high temperature environment at above certain temperatures. Examples of such polyether sulfones having an arene structure include polyether sulfones having structural units represented by Formula (IV).

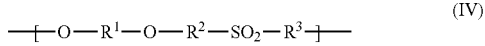
(IV)

In Formula (IV), $R^1$ to $R^3$ are divalent organic groups having an arene structure, and the bonds in Formula (IV) are directly connected to the respective arene structures in $R^1$ to $R^3$ (namely, the oxygen atoms and the $SO_2$ groups in —O—$R^1$—O—, —O—$R^2$—$SO_2$— and —$SO_2$—$R^3$—O— of Formula (IV) are directly connected to the arene structures in $R^1$ to $R^3$). $R^1$ to $R^3$ may be the same or different from one another.

Examples of the divalent organic groups include arylene groups such as phenylene group, naphthalene-diyl group, anthracene-diyl group and pyrene-diyl group; groups in which two arylene groups are directly bonded to each other such as —$C_6H_4$—$C_6H_4$—; and groups in which two arylene groups are bonded via a divalent hydrocarbon group as represented by Formulae (IV-1) to (IV-3).

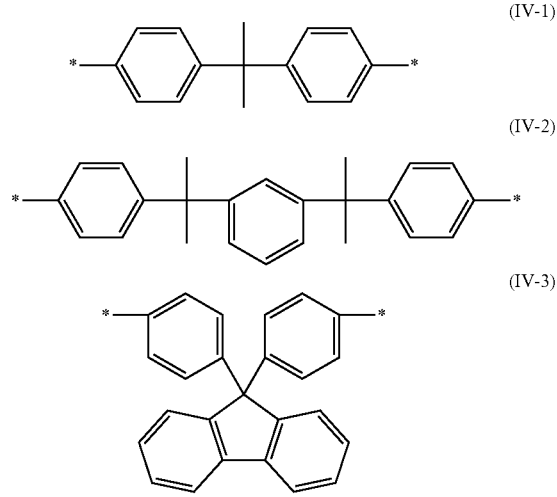

In Formulae (IV-1) to (IV-3), the asterisks * indicate bonds.

Commercial polyether sulfones may also be used. Examples of such commercial polyether sulfones include "ULTRASONE E series" manufactured by BASF Corporation, "RADEL A series" manufactured by SOLVAY SPECIALTY POLYMERS JAPAN K.K., and "SUMIKAEXCEL series" manufactured by Sumitomo Chemical Company. Examples of the SUMIKAEXCEL series include SUMIKAEXCEL (registered trademark) PES 3600P, SUMIKAEXCEL (registered trademark) PES 4100P, SUMIKAEXCEL (registered trademark) PES 4100 MP, SUMIKAEXCEL (registered trademark) PES 4800P, SUMIKAEXCEL (registered trademark) PES 5003P, SUMIKAEXCEL (registered trademark) PES 5200P and SUMIKAEXCEL (registered trademark) PES 5400P.

The polyether sulfones usually have a weight average molecular weight (Mw) of 1,000 to 1,000,000, and preferably 5,000 to 500,000 as measured by GPC relative to polystyrenes. The molecular weight distribution Mw/Mn of the polyether sulfones is usually 1 to 5, and preferably 1 to 3.5, wherein Mn is the number average molecular weight of the polyether sulfone according to GPC.

<<Polycarbonates>>

Examples of the polycarbonates, which are preferred examples of the thermoplastic resins (H), include polyethylene carbonate, polypropylene carbonate, 1,2-polybutylene carbonate, 1,3-polybutylene carbonate, 1,4-polybutylene carbonate, cis-2,3-polybutylene carbonate, trans-2,3-polybutylene carbonate, α,β-polyisobutylene carbonate, α,γ-polyisobutylene carbonate, cis-1,2-polycyclobutylene carbonate, trans-1,2-polycyclobutylene carbonate, cis-1,3-polycyclobutylene carbonate, trans-1,3-polycyclobutylene carbonate, polyhexene carbonate, polycyclopropene carbonate, polycyclohexene carbonate, poly(methylcyclohexene carbonate), poly(vinylcyclohexene carbonate), polydihydronaphthalene carbonate, polyhexahydrostyrene carbonate, polycyclohexanepropylene carbonate, polystyrene carbonate, poly(3-phenylpropylene carbonate), poly(3-trimethylsilyloxypropylene carbonate), poly(3-methacryloyloxypropylene carbonate), polyperfluoropropylene carbonate, polynorbornene carbonate, poly(1,3-cyclohexylene carbonate), and mixtures of two or more kinds of these polycarbonates.

The polycarbonates usually have a weight average molecular weight (Mw) of 5,000 to 100,000, and preferably 10,000 to 100,000 as measured by GPC relative to polystyrenes. The molecular weight distribution Mw/Mn of the polycarbonates is usually 2 to 4, and preferably 2.5 to 4, wherein Mn is the number average molecular weight of the polycarbonate according to GPC.

<<Polyimides>>

Examples of the polyimides, which are preferred examples of the thermoplastic resins (H), include polyimides having structural units represented by Formula (V) (preferably structural units represented by Formula (V')), and polyimides having structural units represented by Formula (VI).

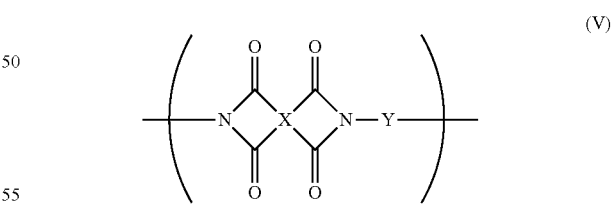
(V)

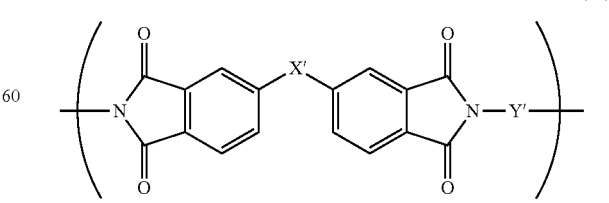
(V')

In Formula (V), X is a tetravalent organic group having 1 to 50 carbon atoms.

In Formula (V), Y is a divalent organic group having 1 to 50 carbon atoms.

In Formula (V'), X' is a group represented by —O—R¹—O—, —C(CF$_3$)$_2$— or —SO$_2$— wherein R¹ is a phenylene group optionally substituted with an alkyl group having 1 to 6 carbon atoms, -Ph-C(CH$_3$)$_2$-Ph- or -Ph-S-Ph- (wherein Ph indicates 1,4-phenylene group).

In Formula (V'), Y' is a divalent group derived from a compound selected from the group consisting of phenylsulfone, aromatic compounds preferably having 6 to 60, more preferably 6 to 30, and still more preferably 6 to 24 carbon atoms, aliphatic compounds preferably having 2 to 15, more preferably 2 to 10, and still more preferably 2 to 6 carbon atoms, and alicyclic compounds preferably having 4 to 60, more preferably 4 to 20, and still more preferably 4 to 12 carbon atoms.

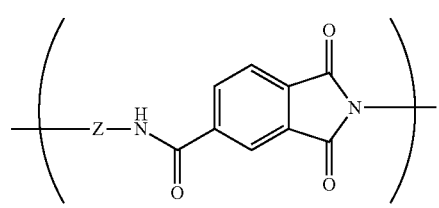

(VI)

In Formula (VI), Z is an organic group having 1 to 50 carbon atoms and preferably having a siloxane bond or an ether bond.

Examples of the organic groups having a siloxane bond include groups represented by the following formula.

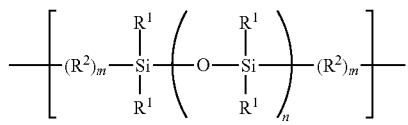

In the formula, the plurality of R¹s are each independently a hydrogen atom, an alkyl group (preferably an alkyl group having 1 to 10, and more preferably 1 or 2 carbon atoms) or a phenyl group; the plurality of R²s are each independently an alkylene group (preferably an alkylene group having 1 to 10, and more preferably 1 or 2 carbon atoms) or a phenylene group; m is an integer of 1 to 6; and n is an integer of 1 to 50, preferably 1 to 20, and more preferably 1 to 10.

Examples of the organic groups having an ether bond include groups represented by the following formulae.

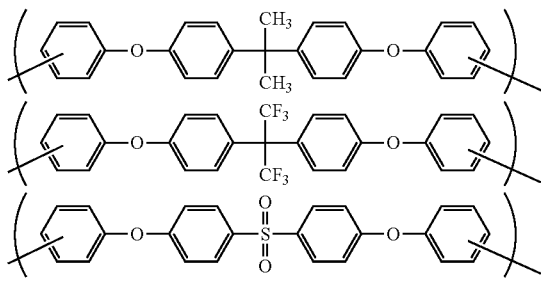

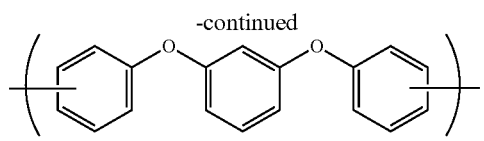

The polyimides preferably have an endcapping group derived from at least one compound selected from hydrocarbons, aromatic monoamines, aliphatic monoamines, alicyclic monoamines and phthalic acid anhydride.

<Thermoplastic Resins (L)>

Examples of the thermoplastic resins (L) having low melting temperature include petroleum resins, novolak resins, phenol aralkyl resins and mixtures of these resins. Of these, petroleum resins and phenol aralkyl resins are preferable because of easy control of the compatibility with the thermoplastic resins (H). Other materials are also employable, with examples including liquid rubbers such as styrene/butadiene rubbers, isoprene/butadiene rubbers and hydrogenated products of these rubbers, as well as ethylene/propylene rubbers; and process oils.

The melting temperature of the thermoplastic resins (L) is usually not more than 200° C., preferably 30 to 150° C., and more preferably 50 to 100° C. By appropriately blending the thermoplastic resins (L) having this melting temperature, the melting temperature of the obtainable layer can be controlled to a low temperature.

<<Petroleum Resins>>

Examples of the petroleum resins, which are preferred examples of the thermoplastic resins (L), include C$_5$ petroleum resins, C$_9$ petroleum resins, C$_5$/C$_9$ mixed petroleum resins, cyclopentadiene resins, vinyl-substituted aromatic compound polymers, olefin/vinyl-substituted aromatic compound copolymers, cyclopentadiene compound/vinyl-substituted aromatic compound copolymers, hydrogenated products of these resins, and mixtures of these resins. Of these, C$_5$ petroleum resins, C$_9$ petroleum resins, C$_5$/C$_9$ mixed petroleum resins, cyclopentadiene resins, vinyl-substituted aromatic compound polymers, hydrogenated products of these resins, and mixtures of these resins are preferable. The C$_5$ petroleum resins are preferably aliphatic resins, and the C$_9$ petroleum resins are preferably alicyclic resins. In particular, C$_9$ petroleum resins, cyclopentadiene resins, hydrogenated products of these resins, and mixtures of these resins are preferable.

The petroleum resins usually have a weight average molecular weight (Mw) of not more than 20,000, preferably 100 to 20,000, more preferably 200 to 10,000, and particularly preferably 300 to 5,000 as measured by GPC relative to polystyrenes.

<<Novolak Resins>>

The novolak resins, which are preferred examples of the thermoplastic resins (L), may be obtained by, for example, the condensation of phenols and aldehydes in the presence of catalysts (for example, oxalic acid).

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol and β-naphthol.

Examples of the aldehydes include formaldehyde, paraformaldehyde, acetaldehyde and benzaldehyde.

Specifically, preferred examples of the novolak resins include phenol/formaldehyde condensed novolak resin, cresol/formaldehyde condensed novolak resin and phenol-naphthol/formaldehyde condensed novolak resin.

The novolak resins usually have a weight average molecular weight (Mw) of not less than 2,000, and preferably 2,000 to 20,000 as measured by GPC relative to polystyrenes. The molecular weight distribution Mw/Mn of the novolak resins is usually 1 to 10, and preferably 1.5 to 5, wherein Mn is the number average molecular weight of the resin according to GPC.

<<Phenol Aralkyl Resins>>

The phenol aralkyl resins, which are preferred examples of the thermoplastic resins (L), are not particularly limited and may be conventional resins.

[Step (2)]

In the step (2), the substrate temporarily fixed on the support is processed and/or the stack is transported. In this transportation step, the substrates (for example, semiconductor wafers) together with the supports are transported between apparatuses. For example, the processing of the substrate temporarily fixed on the support may be any of substrate thinning (for example, backgrinding); photofabrication including one or more treatments selected from etching, sputtered film formation, plating, reflow plating and the like; and dicing.

The step (2) frequently involves various processing solvents. That is, various processing solvents are brought into contact with the temporary fixing material. In the temporary fixing material according to the present invention, the central section (A) is protected by the peripheral section (B) which is resistant to such processing solvents. Thus, a wide choice of resins is possible for the central section (A) without being restricted by the processing solvents.

In photofabrication, resistance (heat resistance) to reflow plating and so on is required. As described above, the substrate treating method of the invention using the inventive temporary fixing materials is advantageous in terms of heat resistance over conventional substrate treating methods.

The implementation of substrate processing is not particularly limited as long as the temperature is such that the holding power of the temporary fixing materials is not lowered. According to the present invention, the temporary fixing material layers exhibit holding power enough to hold (or protect) the substrates during processing at a low temperature as well as in a high temperature environment.

In the following, substrate processing in the production of stacked chips will be described as an example. In the production of stacked chips, through electrodes extending vertically to the surface of semiconductor wafers are formed, and connection electrodes such as pad electrodes and bumps are formed on ends of the through electrodes as well as on wires. The connection electrodes are then connected to one another to establish connections between stacked semiconductor chips.

(i) A resist is applied to a semiconductor wafer as a substrate temporarily fixed on a support via the temporary fixing material in the step (1). The resist is then exposed and developed to form a resist layer patterned with a desired shape. For example, a plurality of circular resist patterns may be formed on the substrate.

(ii) While using the resist layer as a mask, the substrate are etched according to the desired patterns, thereby forming openings (holes). Thereafter, the resist layer is removed with a release liquid or by asking (for example, $O_2$ asking). The etching may be dry etching or wet etching.

(iii) An insulating layer such as $SiO_2$ is formed on the surface of the substrate on which the openings have been formed.

(iv) In order to prevent the diffusion of conductors into the insulating layer, a barrier layer such as TiW or TiN is sputtered. Next, a seed layer such as copper is formed by sputtering.

(v) A resist is applied to the surface of the substrate on which the openings have been formed. The resist is then exposed and developed to form a resist layer patterned to a shape corresponding to the openings in the substrate. Next, the openings in the substrate are filled with a conductor by plating treatment (such as Sn/Cu plating), thereby forming through electrodes. Thereafter, the resist layer is removed, and the barrier layer and the seed layer are removed by dry etching.

(vi) On the through electrodes of the above-processed substrate, connection electrodes such as pad electrodes and bumps are formed by reflowing. Next, the connection electrodes are connected to one another to establish connections between stacked semiconductor chips.

[Step (3)]

After substrate processing or stack transportation has been completed, at least the peripheral section (B) of the temporary fixing material in the stack is removed by being dissolved with a solvent (see FIG. 2, step (3)). The solvent used herein is not particularly limited as long as it can dissolve the peripheral section (B) having high solvent resistance. For example, the solvents used in the preparation of the temporary fixing compositions may be utilized. One, or two or more solvents may be used.

In the case where the peripheral section (B) is composed of a cycloolefin resin, it is preferable that the solvent be a hydrocarbon such as mesitylene, limonene, dipentene, pinene, bicyclohexyl, cyclododecene, 1-tert-butyl-3,5-dimethylbenzene, butylcyclohexane, cyclooctane, cycloheptane, cyclohexane or methylcyclohexane.

Exemplary methods for the removal by dissolution include soaking the stack in the solvent, spraying the solvent to the stack, and ultrasonicating the stack in the solvent. The temperature of the solvent is not particularly limited, but is preferably 20 to 80° C., and more preferably 20 to 50° C. When the removal is carried out by soaking the stack in the solvent, the soaking time is usually 0.5 to 30 minutes.

[Step (4)]

After the peripheral section (B) of the temporary fixing material is removed by dissolution, the residual temporary fixing material (usually the central section (A)) is heated to allow the substrate to be separated from the support (see FIG. 2, step (4)). The substrate may be separated from the support by heating the temporary fixing material to lower the adhesion of at least the support-side outermost layer among the layers of the central section (A) and simultaneously performing shear treatment (usually 0.01 to 5 N/cm$^2$, and preferably 0.02 to 0.5 N/cm$^2$) such as sliding the support and the substrate away from each other in a direction substantially parallel to the temporary fixing surfaces thereof (the surface of the support). Alternatively, the substrate may be separated by being lift in a direction perpendicular to the surface of the support.

For example, the substrate may be separated from the support by sliding the substrate in a direction parallel to the surface of the support while fixing the support or applying a force to the support which resists the force applied to the substrate. In the invention, the term "shear" means that a force is applied in a direction substantially parallel to the temporary fixing surfaces of the support and the substrate.

The temperature in the heat treatment is not less than the melting temperature (referred to as "Tm" in this paragraph) of the support-side outermost layer of the temporary fixing material, preferably in the range from Tm to Tm plus 200° C., and more preferably in the range from Tm to Tm plus 100° C.

In the case where the temporary fixing material remains on the substrate after separation, the residue may be removed by cleaning with one, or two or more kinds of solvents which may be used in the preparation of the temporary fixing compositions (see FIG. 2, step (5)). Exemplary cleaning methods include soaking the substrate in the cleaning liquid, spraying the cleaning liquid to the substrate, and ultrasonicating the substrate in the cleaning liquid. The temperature of the cleaning liquid is not particularly limited, but is preferably 20 to 80° C., and more preferably 20 to 50° C.

Examples of the solvents include hydrocarbons such as limonene, mesitylene, dipentene, pinene, bicyclohexyl, cyclododecene, 1-tert-butyl-3,5-dimethylbenzene, butylcyclohexane, cyclooctane, cycloheptane, cyclohexane and methylcyclohexane; alcohols/ethers such as anisole, propylene glycol monomethyl ether, dipropylene glycol methyl ether, diethylene glycol monoethyl ether and diglyme; esters/lactones such as ethylene carbonate, ethyl acetate, n-butyl acetate, ethyl lactate, ethyl 3-ethoxypropionate, propylene glycol monomethyl ether acetate, diethylene glycol monoethyl ether acetate, propylene carbonate and γ-butyrolactone; ketones such as cyclopentanone, cyclohexanone, methyl isobutyl ketone and 2-heptanone; and amides/lactams such as N-methyl-2-pyrrolidone.

[Stacks]

Stacks of the invention are formed, for example, during the above substrate treating method.

In the stack of the invention, a substrate is temporarily fixed on a support via a temporary fixing material. The temporary fixing material includes a peripheral section (B) with excellent solvent resistance disposed in contact with a peripheral portion of a surface of the support on the substrate side as well as with a peripheral portion of a surface of the substrate on the support side, and a central section (A) having two or more layers and disposed in contact with a central portion of the surface of the support on the substrate side as well as with a central portion of the surface of the substrate on the support side, these central portions being within the insides of the respective peripheral portions. The central section (A) is covered with the support, the peripheral section (B) and the substrate.

According to the invention, temporary fixation of substrates can be effected at a temperature of, for example, 300° C. or below, and the holding power enough to hold (or protect) the substrates during processing can be maintained even in a high temperature environment (for example, 225° C. or above, in detail 225 to 300° C.). For example, the holding power is evaluated based on shear adhesion. Because of these configurations, the inventive stacks exhibit sufficient holding power (shear adhesion) resisting a shear force applied during, for example, processing and/or transportation of the substrates. According to the invention, substrates can be held on supports during processing such as substrate thinning which is performed at around 25° C. as well as photofabrication (for example, etching and sputtered film formation performed at temperatures in the range from 25 to 300° C., and plating and reflow plating taking place at temperatures in the range from 225 to 300° C.)

According to the invention, the shear adhesion at the central section (A) is lowered at a temperature around or above the melting temperature of the support-side outermost layer. (However, the shear adhesion can still hold the substrates against shear force applied during substrate processing as described above.) Thus, appropriate heat and shear treatments induce a separation phenomenon in, for example, the support-side outermost layer, thereby allowing the substrates to be separated from the supports easily.

In addition to the above characteristics (such as temporary fixation ability at 300° C. or below, heat resistance and easy separation), the temporary fixing materials constituting the stacks of the invention exhibit radical resistance during etching, heat resistance during insulating film production and reflowing, and vacuum resistance during sputtering.

With these characteristics, the inventive stacks are suitably adopted in various processing in current economic activities (for example, micromachining of various material surfaces, various surface mounting processes, and transportation of semiconductor wafers and semiconductor elements).

[Semiconductor Devices]

A semiconductor device of the present invention is obtained by the inventive substrate treating method. Because the inventive temporary fixing material can be easily removed at the separation of semiconductor devices such as semiconductor elements, the semiconductor devices such as semiconductor elements are highly free of contamination (for example, smears, burnt deposits) caused by the temporary fixing material. Further, the inventive semiconductor devices have very little damages or wears of the substrates themselves and parts present in the substrates.

EXAMPLES

Embodiments of the present invention will be described in detail based on examples hereinbelow.

1. Preparation of Temporary Fixing Materials 1-1. Temporary Fixing Compositions

The following temporary fixing compositions were used for the formation of temporary fixing materials.

Preparation Example 1

Preparation of Temporary Fixing Composition 1

A temporary fixing composition 1 was prepared by mixing 100 parts by mass of a polyether sulfone ("SUMIKAEXCEL PES 5003P" (product name) manufactured by Sumitomo Chemical Company), 25 parts by mass of a phenol aralkyl resin ("MIREX XLC-3L" (product name) manufactured by Mitsui Chemicals, Inc.) and 500 parts by mass of N-methyl-2-pyrrolidone.

Preparation Example 2

Preparation of Temporary Fixing Composition 2

A temporary fixing composition 2 was prepared by mixing 50 parts by mass of a cycloolefin polymer ("ZEONEX 480R" (product name) manufactured by ZEON CORPORATION), 50 parts by mass of a hydrogenated $C_9$ petroleum resin ("ARKON P-140" (product name) manufactured by Arakawa Chemical Industries, Ltd.) and 400 parts by mass of mesitylene.

1-2. Measurement of Melting Temperatures of Temporary Fixing Compositions and Temporary Fixing Material Layers The temporary fixing composition 1 was applied onto a silicon wafer to form a coating. The coating was heated with a hot plate at 250° C. for 10 minutes to give an 800 μm thick film (a temporary fixing material layer 1). The film was tested with a rheometer ("AR-G2 Rheometer" manufactured by TA Instruments Japan Inc., frequency=0.08 Hz) to determine the temperature at which the viscosity became 1,000 Pa·s (the melting temperature). The melting temperature was determined to be in the range from 250 to 280° C.

The temporary fixing composition 2 was applied onto a silicon wafer to form a coating. The coating was heated with a hot plate at 250° C. for 10 minutes to give an 800 μm thick film (a temporary fixing material layer 2). The film was tested in the similar manner as above to determine the temperature at which the viscosity became 1,000 Pa·s (the melting temperature). The melting temperature was determined to be in the range from 200 to 210° C.

1-3. Solvent Resistance of Temporary Fixing Materials

The temporary fixing composition 1 was applied onto a silicon wafer to form a coating. The coating was heated with a hot plate at 250° C. for 10 minutes to give a 40 μm thick film (a temporary fixing material layer). The temporary fixing material layer was dipped in a solvent (NMP) (23° C., 0.5 hours). The temporary fixing material layer was dissolved in NMP and disappeared.

The temporary fixing composition 2 was applied onto a silicon wafer to form a coating. The coating was heated with a hot plate at 250° C. for 10 minutes to give a 40 μm thick film (a temporary fixing material layer). The temporary fixing material layer was dipped in a solvent (NMP) (23° C., 0.5 hours). The temporary fixing material layer was not dissolved in NMP. This result confirmed that the temporary fixing material layer formed from the temporary fixing composition 2 had solvent resistance.

2. Evaluations

Experiment Example 1

See FIGS. 3A(1), 3A(2), 3B, and 3C

The temporary fixing composition 1 was spin coated onto a silicon wafer 51 having a diameter of 4 inches. The coating was heated with a hot plate at 250° C. for 10 minutes. Thus, a plate 50 was obtained which had the silicon wafer 51 and a film 52 (a temporary fixing material layer 1) with a thickness of 40 μm and an EBR width of 1 mm.

Next, the temporary fixing composition 2 was spin coated onto a glass plate 61 having a diameter of 4 inches. The coating was heated with a hot plate at 250° C. for 10 minutes. Thus, a plate 60 was obtained which had the glass plate 61 and a film 62 (a temporary fixing material layer 2) with a thickness of 60 μm formed on the entire surface of the glass plate 61.

The plate 50 and the plate 60 were stacked together such that the temporary fixing material layer 1 and the temporary fixing material layer 2 were placed in contact with each other. With a die bonder, a 50 N force was applied to the stack at 250° C. for 90 seconds, thereby producing a stack 70 of Experiment Example 1 illustrated in FIG. 3C in which the silicon wafer 51 and the glass plate 61 were stacked one on top of the other via the temporary fixing material.

The stack was dipped in a solvent (NMP) (23° C., 0.5 hours).

After being dipped, the stack was tested with a universal bond tester ("DAGE 4000" (product name) manufactured by Dage Japan Co., Ltd.) by applying a shear force to the glass plate and the silicon wafer (at a rate of 500 μm/sec and 23° C. to 20 N/cm$^2$) in a direction parallel to the glass plate. The silicon wafer and the glass plate remained bonded together without any displacement.

After being subjected to the shear force, the stack was dipped in a solvent (mesitylene) (23° C., 0.5 hours), thereby dissolving and removing the peripheral section.

After the peripheral section was removed, the stack was tested with the universal bond tester ("DAGE 4000" (product name) manufactured by Dage Japan Co., Ltd.) by applying a shear force to the glass plate and the silicon wafer (at a rate of 500 μm/sec and 250° C. up to 1 N/cm$^2$) in a direction parallel to the glass plate. The silicon wafer was successfully separated from the glass plate.

The separated silicon wafer was dipped in mesitylene at 23° C. for 10 minutes and further in NMP at 23° C. for 0.5 hours. After being dipped, the silicon wafer was inspected for any residual temporary fixing material layer 1 and temporary fixing material layer 2. The silicon wafer was found to have been cleaned of the temporary fixing material layer 1 and the temporary fixing material layer 2.

REFERENCE SIGNS LIST 10 a support
11 a central portion
12 a peripheral portion
20 a substrate
21 bumps
30 a central section (A)
31 a substrate side layer
32 a support side layer
40 a peripheral section (B)
50 a plate
51 a silicon wafer
52 a film
60 a plate
61 a glass plate
62 a film
70 a stack
W EBR width

What is claimed is:

1. A substrate treating method comprising, in the sequence set forth,
   (1) a step of temporarily fixing a substrate onto a support via a temporary fixing material,
   the temporary fixing material comprising a central section (A) having two or more layers and a peripheral section (B) with excellent solvent resistance,
   the peripheral section (B) being in contact with a peripheral portion of a surface of the support on the substrate side as well as with a peripheral portion of a surface of the substrate on the support side,
   the central section (A) being in contact with a central portion of the surface of the support on the substrate side as well as with a central portion of the surface of the substrate on the support side, these central portions being within the insides of the respective peripheral portions,
   the temporary fixing thus resulting in a stack in which the central section (A) is covered with the support, the peripheral section (B) and the substrate;
   (2) a step of processing the substrate and/or transporting the stack;
   (3) a step of dissolving at least the peripheral section (B) of the temporary fixing material with a solvent; and
   (4) a step of heating the residue of the temporary fixing material and separating the substrate from the support.

2. The substrate treating method according to claim 1, wherein a layer of the central section (A) disposed in contact with the substrate has the highest melting temperature among the peripheral section (B) and the layers forming the central section (A).

3. The substrate treating method according to claim 1, wherein a layer of the central section (A) disposed in contact with the support, and the peripheral section (B) are composed of an identical resin.

4. The substrate treating method according to claim 2, wherein a layer of the central section (A) disposed in contact with the support, and the peripheral section (B) are composed of an identical resin.

5. The substrate treating method according to claim 3, wherein the step (1) comprises
- a step (1a) of forming a temporary fixing material layer (b) with excellent solvent resistance on the entirety of a surface of the support on the substrate side,
- a step (1b) of forming a temporary fixing material layer (a) on a central portion of a surface of the substrate on the support side, the temporary fixing material layer (a) having a higher melting temperature than the temporary fixing material layer (b), and
- a step (1c) of arranging the support and the substrate such that the temporary fixing material layer (b) and the temporary fixing material layer (a) are opposed to each other, and bonding the temporary fixing material layer (b) and the temporary fixing material layer (a) to each other while heating the temporary fixing material layer (b), thereby forming a peripheral section (B) composed of part of the temporary fixing material layer (b) and a central section (A) composed of the remaining part of the temporary fixing material layer (b) and the temporary fixing material layer (a).

6. The substrate treating method according to claim 4, wherein the step (1) comprises
- a step (1a) of forming a temporary fixing material layer (b) with excellent solvent resistance on the entirety of a surface of the support on the substrate side,
- a step (1b) of forming a temporary fixing material layer (a) on a central portion of a surface of the substrate on the support side, the temporary fixing material layer (a) having a higher melting temperature than the temporary fixing material layer (b), and
- a step (1c) of arranging the support and the substrate such that the temporary fixing material layer (b) and the temporary fixing material layer (a) are opposed to each other, and bonding the temporary fixing material layer (b) and the temporary fixing material layer (a) to each other while heating the temporary fixing material layer (b), thereby forming a peripheral section (B) composed of part of the temporary fixing material layer (b) and a central section (A) composed of the remaining part of the temporary fixing material layer (b) and the temporary fixing material layer (a).

* * * * *